United States Patent [19]

Holcombe, Jr. et al.

[11] 4,228,142

[45] Oct. 14, 1980

[54] PROCESS FOR PRODUCING DIAMOND-LIKE CARBON

[76] Inventors: Cressie E. Holcombe, Jr., 1613 Blackwood Dr., Knoxville, Tenn. 37919; James B. Condon, 511 Robertsville Rd.; D. H. Johnson, 113 Morgan Rd., both of Oak Ridge, Tenn. 37830

[21] Appl. No.: 71,778

[22] Filed: Aug. 31, 1979

[51] Int. Cl.$^2$ .............................................. C01B 31/02
[52] U.S. Cl. ................................... 423/449; 423/341; 423/445; 423/446; 423/448; 427/249
[58] Field of Search ............... 423/445, 446, 448, 449, 423/458, 341, 344, 345, 346; 427/122, 249

[56] References Cited

U.S. PATENT DOCUMENTS

| | | | |
|---|---|---|---|
| 3,733,394 | 5/1973 | Whittaker | 423/445 X |
| 3,961,103 | 6/1976 | Aisenberg | 423/446 X |

OTHER PUBLICATIONS

Badami, "Carbon", vol. 3, 1965, pp. 53–57.
Osetsky, "Carbon", vol. 12, 1974, pp. 517–523.
Leeds et al., "I & EC Product Research and Development", vol. 8, No. 3, 1969, pp. 223–236.

*Primary Examiner*—Edward J. Meros
*Attorney, Agent, or Firm*—Martin J. Skinner

[57] ABSTRACT

A process is described for the production of dense metastable phases of carbon which have characteristics similar to diamond. Particulates of the metastable carbon are produced by reacting silicon carbide or a silicon carbide precursor, such as a silane or silicon metal, with a fluorocarbon, such as carbon tetrafluoride at a temperature greater than about 800° C. A preferred range is from about 900° C. to 1200° C. The reaction may be carried out in a high voltage electrical diacharge, or other plasma, or in a furnace. The presence of a "promoter" metal, such as nickel and iron, increases the reaction rate and the quantity of the metastable carbon phases. Relatively large quantities of these diamond-like particulates are produced, and their properties are such as to make them useful for many of the same applications for which commercial diamonds are utilized. They are also useful in numerous high temperature applications. Layers of the metastable carbon phases may be applied to substrates to produce hard and impermeable surfaces thereby producing cutting elements, styli, etc.

24 Claims, No Drawings

PROCESS FOR PRODUCING DIAMOND-LIKE CARBON

BACKGROUND OF THE INVENTION

This invention relates to a process of producing carbon particles and/or deposits, and more particularly to the simplified preparation of dense carbon having properties approaching those of commercial-grade diamond particles. These high density carbons are grouped under the term metastable carbon phases and generally have a density greater than 2.26 g/cm$^3$. Products termed "metastable carbon phases" typically include diamond, lonsdaleite (or hexagonal diamond), chaoite and carbon VI (sometimes called white carbon), α-carbyne and β-carbyne.

In the past, the high density carbon phases have been formed by using unusual temperatures and/or pressures. For example, vitreous carbon heated to 2000°–3000° C. during manufacture was shown to contain such products. In still other work, graphitic carbon was heated above 2300° C. in a range of $10^{-4}$ Torr to 1 atmosphere to produce carbon VI. Chaoite was produced during graphite sublimation at 2400°–2700° C. and $10^{-4}$ Torr. Lonsdaleite has been produced with a static pressure exceeding 130 Kbar and a temperature greater than 1000° C.

Diamond can be produced at 130 Kbar and 3000° C.; or, with Ni or Fe catalysts, at 27 Kbar and 1400° C. Additionally, shock-wave synthesis of diamond from 0.3 to 1.5 Mbar at about 1000°–2000° C. has been utilized. In other work, diamond or diamond-like carbon has been produced by ion beam deposition from a plasma at $10^{-3}$ to $10^{-6}$ Torr with high voltage, e.g., 40 V or about several thousand degrees. Epitaxial diamond growth from methane on diamond seed crystals at about 1000° C. in the presence of hydrogen, with pressures from 0.15 to 458 Torr, has been reported. Carbynes (both α and β) have been produced by oxidizing copper acetylides at atmospheric pressure, followed by acid leaching and a 1000° C. vacuum heat treatment.

The conditions of these processes are such that only limited quantities of the desired product can be produced. Thus, it would be desirable to have a process that operates under more moderate conditions and that can be utilized to produce large quantities of dense carbon in either a batch or a continuous operation.

SUMMARY OF THE INVENTION

The invention relates to the production of metastable carbon phases using a reaction between a fluorocarbon and silicon carbide or a precursor of silicon carbide, the latter being typically in the form of a halogenated alkyl silane or silicon metal. The reaction is carried out at a temperature above about 800° C. at substantially atmospheric pressure. It is specifically exemplified by reacting SiC with CF$_4$ in a furnace at a temperature between about 800° C. and 1200° C.; and by reacting methyltrichlorosilane with CF$_4$ in a plasma, such as a high voltage electrical discharge, or upon a heated substrate. In the SiC-CF$_4$ reaction, the reaction time is shortened by the use of a promotor metal such as nickel or iron. The reaction conditions are such that continuous processing may be performed, if desired. The products may be particulates or a deposited layer, depending upon process conditions.

DESCRIPTION OF THE PREFERRED EMBODIMENTS

The present invention is a process for producing particles or films of very dense, and hard, carbon that have properties approaching those of a diamond. The resultant products have a number of potential uses. The hard particles, themselves, may be incorporated into any conventional matrix to form abrasive elements such as cutting tools, grinding wheels, etc. Under some processing conditions, the dense carbon particles are present in a mixture with graphite. Since the dense particles are very small, as described below, the mixture will be useful as a polishing medium, the graphite providing some lubricating action for the polishing action of the hard particles. In addition, the mixture or the hard particles alone may be incorporated into bodies for high temperature applications.

The invention, in its broadest terms, is a reaction between a fluorocarbon and silicon carbide or a silicon carbide precursor at temperatures greater than about 800° C. The reaction may be carried out in a completely gaseous condition, as when the silicon precursor is in gaseous form, or as a gas-solid reaction. When the silicon carbide is an extended surface, the high density carbon forms as a layer on that surface. This provides a hardened surface to items such as cutting devices (knives, razor blades, etc.) and pointed objects (stylus for record layers and the like).

While the reaction can be carried out at or slightly above an equilibrium temperature of 800° C., a temperature above 900° C. to about 1200° C. provides a more rapid formation of the metastable carbon phases. A temperature near 1000° C. is preferred. The reaction is assisted by metallic "promoters" which increase the rate of reaction at any of the temperatures. These additives are called promoters as their actual function in the reaction is not known.

The present invention has been demonstrated using both silicon carbide (SiC) and precursors of SiC. Both β-SiC (cubic close-packed) and α-SiC (hexagonal) have been utilized. A typical precursor of SiC is methyltrichlorosilane; another is silicon metal. Carbon tetrafluoride has been used as an example of a fluorocarbon either alone or in combination with hydrogen. While not wishing to be bound by theory, it is believed that the chemical reactions for producing the metastable carbon phases from these starting materials are metathesis reactions, as:

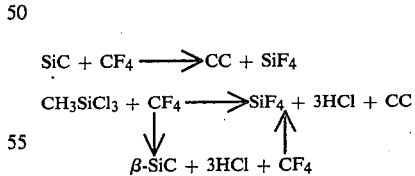

The invention will be further clarified by a consideration of the following examples, which are intended to be purely exemplary of the use of the invention.

EXAMPLE 1

Beta-silicon carbide was prepared by heating silicon powder (mean particle size d=10.2 μm, ≧99% pure by mass spectrographic analysis) mixed with natural flake graphite (d=6.9 μm, 99.5% pure) at 1500° C. for 1 hr followed by rapidly (~1 min) quenching to room temperature. A 5 mol% excess of Si was used to provide a Si-rich environment which is favorable to β-SiC formation. The resulting SiC was shown by x-ray diffraction (XRD) analysis to be beta-phase and to contain a minor amount of Si. Mass spectrographic analysis indicated purity greater than 99.6%. Scanning electron microscopy revealed that the particle size was about 15 $\mu$m; electronic particle counting techniques indicated that 90 wt % of the particles were <32 $\mu$m, 10 wt % were <5 $\mu$m, mean d=16 $\mu$m, and the overall particle range was 2.5–60 $\mu$m.

Individual one-half gram samples of the as produced β-SiC were reacted with carbon tetrafluoride in a carbon crucible in a conventional graphite-tube furnace. The $CF_4$ (>99% pure, obtained from Air Products Corp.) flow rate was 0.4 liter/hr, and the reaction was studied over a temperature range of 500° to 1000° C. One sample was heated at each 50° C. interval over the range for times ranging from 3 weeks at 500° C. to 1 hour at 1000° C. Resultant products were examined by XRD, selected-area electron diffraction (SAED) and electron microscopy.

Various secondary reactions were evidenced in a range of 500°–750° C. A reaction temperature in the range of about 800°–850° C. produced some textured graphite and, above about 900° C., the primary constituents of the product were dense carbon (metastable carbon phases) and amorphous carbon.

EXAMPLE 2

One-half gram of β-SiC, as produced in Example 1, was heated at 1000° C. in a graphite boat in a stainless steel tube under flowing, pure $CF_4$ (about 0.4 liter/hr) for about 16 hours. Some reaction with the stainless tube was noted. The product from the β-SiC reaction was analyzed by XRD and electron diffraction, and a primary amount of metastable carbon phases was detected, including lonsdaleite and/or diamond.

EXAMPLE 3

The reaction of β-SiC, as produced in Example 1, with $CF_4$ was studied in a nickel tube. The conditions were as set forth in Example 2 except the time was only about 4 hr. The product from the reaction of the SiC and $CF_4$ was analyzed by XRD and electron diffraction and showed essentially the same products as those in Example 2.

EXAMPLE 4

The test of Example 3 was repeated with a graphite tube rather than the nickel tube. The time was 4 hours: no tube reaction was noted. The primary products of the reaction, as identified by XRD and electron diffraction, were amorphous carbon with minor amounts of carbon VI or lonsdaleite.

On the basis of weight changes, the desired reaction was approximately 55% complete after the 4 hr test at 1000° C.; about 99% of the product had a density greater than 2.26 g/cm$^3$. With a similar treatment at 900° C., the reaction appeared to be only about 25% complete.

EXAMPLE 5

The reaction of β-SiC with $CF_4$, as set forth in Example 4, was repeated except that 5 wt % (0.0263 g) pure nickel powder was mixed with the SiC in the graphite boat. After 4 hr at 900° C. the reaction was 40% complete; and at 1000° C., the reaction was about 80% complete. Well over 90% of the product had a density greater than 2.26 g/cm$^3$.

EXAMPLE 6

The reaction conditions of Example 4 for the reaction of β-SiC and $CF_4$ were duplicated with the exception that 5 wt % (0.0263 g) pure iron powder was mixed with the SiC. After 4 hr at 900° C., the reaction was about 35% complete. At 1000° C. after 4 hr, however, the reaction was substantially 100% complete; the yield of material greater than 2.26 g/cm$^3$ was about 66%. This indicated that substantial amounts of metastable carbon phases were produced with the iron promoter. XRD indicated an intermediate amount of diamond in the product after this 1000° C. treatment, whereas after a similar treatment at 900° C., a minor amount of diamond was detected.

EXAMPLE 7

Commercial alpha-silicon carbide, purchased from Carborundum Co., of a purity corresponding to that of the β-SiC of Example 1 was reacted with carbon tetrafluoride in the manner described in Example 4. After 4 hours the reaction was about 70% complete, and about 100% had a density greater than 2.26 g/cm$^3$.

EXAMPLE 8

Five wt % Ni was added to α-SiC and the conditions of Example 7 were employed. After 4 hours the reaction was about 80% complete, with about 100% of the product having a high density.

EXAMPLE 9

A mixture of α-SiC and 5 wt % Fe powder was treated as set forth in Example 7. After 4 hr substantially complete reaction had occurred; a small portion (~1%) of the product had a density greater than 2.26 g/cm$^3$.

EXAMPLE 10

The reaction of methyltrichlorosilane (MTS) with $CF_4$ was carried out in a high voltage electrical discharge (plasma) reactor using a point discharge crossed electrode arrangement, with a cross flow of the reactant gas mixture. Details of a typical reactor of this type are described in "Chemical Reactions in Electrical Discharges," J. D. Thornton, Advances in Chemistry Series, No. 80 (R. F. Gould, Ed.), p. 372, American Chemical Society, Washington, D.C. (1969), the disclosure of which is hereby incorporated by reference herein. Generally, about a 6 mm gap existed between the ~0.3 mm diameter tungsten electrodes.

The MTS was introduced to the reactor after passing a slow flow of $CF_4$ (~0.4 l/min) through the commercial grade (nominally >97% pure) liquid silane. In order to produce a 1:1 molar ratio of the compounds, the silane was heated to 45.2° C. which provided a 0.5 atm vapor pressure of the MTS.

The product powder was brown-to-black and exhibited a "gritty" characteristic. Analysis indicated the material to be composed of 20–30 Å spherical, amorphous particles. Normal mulling techniques used to prepare specimens for electron microscopy introduced material from the equipment indicating the high hardness of the material. Examination of the product after a heat treatment in argon at 600°–800° C. identified numerous chaoite platelets of about 0.1 to 2 $\mu$m size. Attempts to dissolve the particulates with oxidizing acids, which are useful for graphite, were generally unsuccessful thus further indicating them to be nongraphite.

EXAMPLE 11

The formation of deposits onto a heated tungsten coil in a $CF_4$-MTS atmosphere was studied in the temperature range 900°–1200° C. Additions of hydrogen (~50%) to the $CF_4$ were used to aid MTS decomposition at the heated surface. This effectively diluted the $CF_4$ and thus the ratio $CF_4$:MTS was about 1:2. At the lower temperature only a thin deposit resulted on the coil. At least a portion of this deposit appeared, upon analysis, to be a metastable form of carbon. At the 1200° C. temperature, the deposit formed readily. Again, some metastable carbon appeared to have been produced along with some β-SiC and graphite. The deposits at both temperatures were hard and adherent.

EXAMPLE 12

An experiment was conducted to substantially combine the conditions in both Examples 10 and 11. $CF_4$ was bubbled through MTS under conditions to provide a 1:1 mol ratio. The mixture was passed through the aforementioned high voltage discharge reactor using a cross discharge arrangement around a heated tungsten coil. The coil was maintained at 850°–900° C. The product consisted of, primarily, very gritty, chunky particles loosely adhering to the coil. The product powder was leached in acid solutions that dissolve graphite or tungsten. Analysis of the leached powder indicated a substantial proportion of amorphous carbon; however, a portion exhibited the characteristics of one or more form of metastable carbon.

EXAMPLE 13

Ultrafine SiC was prepared by utilizing the high voltage electrical discharge apparatus, as described in Example 10, with MTS introduced to the reactor by passing a slow flow of argon (~0.4 liter/min) through the liquid silane at room temperature (about 22° C.) providing 0.2 atm of MTS. In this manner, the MTS decomposed to SiC and HCl. Electron microscopy showed the powder to be ~20–30 Å (or 0.002–0.003 μm) spheres.

The as-produced ultrafine SiC (1 mg) sample was heated at 8° C./min in a platinum crucible in flowing (4.4 liter/hour) carbon tetrafluoride atmosphere in a conventional thermoanalyzer furnace to 1000° C. and held for 5 minutes. Electron diffraction of the reacted powder showed relatively large (0.1 to 1 μm) carbon VI crystals as the product.

EXAMPLE 14

A hard and/or impermeable film of layer of high density carbon may be applied to a substrate. This is accomplished by decomposing a halogenated alkyl silane (e.g., MTS) upon the surface of the substrate while maintaining the substrate surface at about 1000° C. The silane is carried to the surface using argon, for example. The deposit is a film or layer of SiC. After flushing out excess silane, a fluorocarbon (e.g., $CF_4$) is flowed over the surface while maintaining the surface at above 800° C. for a time sufficient to completely react with the SiC and produce a film or layer of substantially pure high density (metastable) carbon.

For thicker layers, the steps are repeated.

EXAMPLE 15

Films or layers of metastable carbon phases on a substrate may be produced at a faster rate than occurs under the conditions of Example 14 if a metal promoter is employed. Accordingly, a thin coating of metal (e.g., Fe, Ni) is applied to the substrate prior to or after the SiC deposition. The reaction with the $CF_4$ is then carried out. The metal layer is applied using conventional technologies, including vapor deposition, electro-deposition, etc. When a stainless steel substrate is utilized, the iron and nickel of the steel provide the promoter for the SiC-$CF_4$ reaction.

As in Example 14, subsequent films or layers are applied to produce a desired thickness of the dense metastable carbon. The foregoing examples set forth typical demonstrations of the invention. Further details are presented in publications of the inventors: "Metastable Carbon Phases from $CF_4$ Reactions, Part I. Reactions with SiC and Si. Part II. Reactions with $CH_3SiCl_3$", High Temperature Science, 10, 183–195 and 197–210 (1978). The disclosures within these publications are hereby incorporated by reference herein.

On the basis of the results set forth above, it appears that the onset of the desired reaction begins at about 800° C. or above. A temperature range of 900°–1200° C. provides a suitable reaction; a preferred temperature is about 1000° C. for the conditions described. An upper equilibrium temperature of about 1200° C. exists because, above that temperature the metastable carbon phases may be transformed into the more stable graphite. It is recognized that temperatures greater than 1200° C. are reached in the plasmas; however, the product is only at that temperature instantaneously and essentially no transformation can occur. For that reason, other type plasmas may be utilized in the same manner as set forth in Example 10.

In view of the foregoing examples of producing metastable carbon phases, one of ordinary skill in the art would recognize that related chemical compounds may be substituted for those of the examples. For example, other halogenated alkyl silanes may be utilized rather than the methyltrichlorosilane. They are, or act like, precursors of SiC. Since a silicon to carbon ratio of 1 should minimize the formation of amorphous carbon, other specific silanes of the group having a Si/C of 1 are methyltribromosilane ($CH_3SiBr_3$), methyltriiodosilane ($CH_3SiI_3$), and dimethyltetrachlorodisilane [$(CH_3)_2Si_2Cl_4$].

In a similar manner, there are equivalent compounds to $CF_4$ that contain carbon and fluorine in the general class of fluorocarbons. Typical of such fluorocarbons which may be used in the present invention are perfluoroethane ($C_2F_6$), perfluorocyclohexane ($C_6F_{12}$) and difluoromethane ($CF_2H_2$). The use of $H_2$ with $CF_4$ in Example 11 could be equivalent to $CF_2H_2$.

Other metals may be used in the same manner as the nickel and iron described in the examples. The metal must be unstable in the presence of the fluorocarbon, and the resultant fluoride should be volatile under the reaction temperature. Typical of other metals that may be utilized are chromium and aluminum. Since Ni, Fe and Cr are major constituents of stainless steel, stainless steel in any form (powder, reaction vessel wall, etc.) may be utilized to increase the efficiency of the reaction producing the metastable carbon phases.

Because the promoter metal is unstable in the presence of the fluorocarbon, including the $CF_4$, the metal need not physically be in contact with the silicon carbide. Thus, when silicon carbide is heated in a furnace, the $CF_4$ may be passed over or through a bed of the promoter metal prior to contact with the SiC. This act is effected, for example, in Examples 2 and 3 where a stainless steel tube and a nickel tube, respectively, were used in the furnace. Furthermore, this method may be substituted for the deposition of the promoter metal as described in Example 15.

Since the first reaction of $CF_4$ upon elemental silicon (e.g., single crystal Si) is the formation of SiC, the metastable carbon phases may be deposited upon pure silicon.

The process of the invention may be carried out in apparatus different from that described in the examples. For the large scale production of the metastable carbon phases, for example, a fluidized bed reactor may be utilized. The SiC, with or without the metal additive, may be fluidized with the $CF_4$. An inert gas may be added if such is necessary for proper fluidization. The details of fluid bed reactors are well known to persons skilled in the art.

In the carrying out of the desired reaction, a portion of the reaction products and/or residual reactants may be present at the conclusion of processing. Since there is a density difference between graphite and the metastable carbon phases, a conventional density gradient apparatus may be utilized. Furthermore, an acid solution, such as boiling 1 part concentrated nitric acid+3 parts concentrated sulfuric acid, will dissolve the graphite without dissolving the metastable carbon phase; thus, effecting a separation. The dense carbon product may then be incorporated, using conventional techniques, in devices for abrasives, etc., or into bodies for high temperature applications or the like. For some applications, such as a polishing medium, the mixture from the reaction vessel may be utilized without separation.

Other embodiments of the invention will be apparent to one skilled in the art from a consideration of this specification or practice of the invention disclosed herein. It is intended that the specification and examples be considered as exemplary only, with the true scope and spirit of the invention being indicated by the following claims.

I claim:

1. A process for producing metastable carbon phases which comprises reacting a fluorocarbon with silicon carbide or a precursor of silicon carbide at a temperature of above about 800° C.

2. The process of claim 1 wherein the precursor of silicon carbide is silicon.

3. The process of claim 1 wherein the precursor of silicon carbide is a halogenated alkyl silane.

4. The process of claim 3 wherein the halogenated alkyl silane has a silicon-to-carbon ratio of 1.

5. The process of claim 4 wherein the halogenated alkyl silane is selected from the group consisting of methyltrichlorosilane, methyltribromosilane, methyltriiodosilane and dimethyltetrachlorodisilane.

6. The process of claim 1, 2 or 3 where the fluorocarbon is selected from the group consisting of carbon tetrafluoride, perfluoroethane, perfluorocyclohexane and difluoromethane.

7. A process for producing metastable carbon phases which comprises reacting silicon carbide and carbon tetrafluoride at a temperature between about 800° and 1200° C.

8. The process of claim 7 wherein the temperature is about 1000° C.

9. The process of claim 7 wherein the silicon carbide is β-SiC.

10. The process of claim 7 wherein the reacting step is carried out in the presence of a promoter metal selected from a group consisting of iron, nickel, chromium, aluminum and alloys thereof.

11. The process of claim 10 wherein the carbon tetrafluoride is contacted with the promoter metal prior to reacting with the silicon carbide.

12. The process of claim 10 wherein about 5 wt % iron is mixed with the silicon carbide prior to the reacting step with the carbon tetrafluoride.

13. The process of claim 10 wherein about 5 wt % nickel is mixed with the silicon carbide prior to the reacting step with the carbon tetrafluoride.

14. The process of claim 12 wherein the silicon carbide is β-SiC having a particle range of about 0.002 to 60 μm, and the reacting temperature is about 1000° C.

15. The process of claim 14 wherein the reacting step is carried out by placing the β-SiC and 5 wt % Fe in a graphite boat in a graphite tube furnace heated at about 1000° C. and flowing the $CF_4$ through the furnace for a time sufficient to effect the reaction between the β-SiC and the $CF_4$ to produce the metastable carbon phases.

16. A process for producing metastable carbon phases which comprises heating a mixture of methyltrichlorosilane and carbon tetrafluoride at a temperature greater than about 800° C.

17. The process of claim 16 wherein the mole ratio of $CF_4$ to $CH_3SiCl_3$ is from about 1:1 to about 1:2.

18. The process of claim 16 wherein the reacting step is carried out in a plasma.

19. The process of claim 16 wherein the reacting step is carried out upon a substrate heated to above 800° C.

20. A process for producing a film of metastable carbon phases on a substrate which comprises heating the substrate to above about 800° C., flowing methyltrichlorosilane past the heated substrate forming a film of SiC upon the substrate, and then flowing carbon tetrafluoride past the heated film of SiC to react with the SiC and produce the film of the metastable carbon phases.

21. The process of claim 20 further comprising applying a film of iron to the substrate prior to the reacting of the SiC with the carbon tetrafluoride.

22. The process of claim 20 further comprising contacting the carbon tetrafluoride with a promoter metal selected from a group consisting of iron, nickel, chromium, aluminum, and alloys thereof, prior to flowing past the heated film of the SiC.

23. The process of claim 7 wherein the reacting step is carried out in a fluidized bed reactor.

24. The process of claim 1 further comprising separating said metastable carbon phases from said reactants and from other products of the reaction.

* * * * *